United States Patent
Craig et al.

(10) Patent No.: US 11,799,183 B2
(45) Date of Patent: Oct. 24, 2023

(54) SYSTEM, APPARATUS, AND METHOD FOR PRODUCING PRINTED ELECTRICALLY CONDUCTIVE LINES

(71) Applicant: Xerox Corporation, Norwalk, CT (US)

(72) Inventors: David C. Craig, Pittsford, NY (US); Eliud Robles Flores, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 785 days.

(21) Appl. No.: 16/513,873

(22) Filed: Jul. 17, 2019

(65) Prior Publication Data
US 2021/0021011 A1 Jan. 21, 2021

(51) Int. Cl.
*H01P 3/08* (2006.01)
*H05K 1/02* (2006.01)
*H05K 3/10* (2006.01)

(52) U.S. Cl.
CPC ........... *H01P 3/088* (2013.01); *H05K 1/0296* (2013.01); *H05K 3/102* (2013.01); *Y10T 29/49117* (2015.01)

(58) Field of Classification Search
CPC ...... H05K 1/0296; H05K 3/088; H05K 3/102; Y10T 29/49117
See application file for complete search history.

(56) References Cited

U.S. PATENT DOCUMENTS

| | | | | |
|---|---|---|---|---|
| 5,114,744 A | * | 5/1992 | Cloutier | H05K 3/102 427/191 |
| 5,846,854 A | * | 12/1998 | Giraud | G02F 1/155 438/668 |
| 7,106,997 B2 | * | 9/2006 | Stulc | G03G 15/1645 399/302 |
| 7,176,900 B2 | * | 2/2007 | Romansky | G06K 19/07749 345/173 |
| 8,308,887 B2 | * | 11/2012 | Isebo | H05K 3/4061 156/235 |
| 8,580,331 B2 | * | 11/2013 | Suchy | G03G 15/1625 399/223 |
| 8,628,818 B1 | * | 1/2014 | Sharma | H05K 1/09 427/256 |
| 8,671,563 B2 | * | 3/2014 | Maijala | G03G 15/224 29/851 |

(Continued)

FOREIGN PATENT DOCUMENTS

| CN | 102833955 A | * | 12/2012 |
|---|---|---|---|
| EP | 3363 B1 | * | 12/1982 |

(Continued)

OTHER PUBLICATIONS

U.S. Appl. No. 16/180,713, filed Nov. 5, 2018.
U.S. Appl. No. 16/180,813, filed Nov. 5, 2018.
U.S. Appl. No. 16/180,762, filed Nov. 5, 2018.

*Primary Examiner* — Peter Dungba Vo
*Assistant Examiner* — Jose K Abraham
(74) *Attorney, Agent, or Firm* — Simpson & Simpson, PLLC

(57) ABSTRACT

A method of producing an electrically conductive line, the method including providing a substrate, printing a first layer on the substrate, applying a powdered conductive material to the first layer, and bonding the powdered conductive material to the first layer.

20 Claims, 8 Drawing Sheets

(56) References Cited

U.S. PATENT DOCUMENTS

| | | | |
|---|---|---|---|
| 8,911,608 B1* | 12/2014 | Sharma | C23C 18/1653 427/98.5 |
| 10,154,585 B2* | 12/2018 | Yatsuka | C08J 7/044 |
| 10,277,756 B2 | 4/2019 | Spence et al. | |
| 10,315,402 B2* | 6/2019 | Brook | D06C 15/00 |
| 2002/0034617 A1* | 3/2002 | Eberlein | H05K 3/102 428/209 |
| 2004/0074676 A1* | 4/2004 | Romansky | G06K 19/07749 178/18.01 |
| 2004/0074963 A1* | 4/2004 | Pierce | G06K 19/0723 235/383 |
| 2004/0075348 A1* | 4/2004 | Obrea | G06K 19/07749 307/125 |
| 2006/0181600 A1* | 8/2006 | Bourdelais | B41M 5/38207 347/199 |
| 2008/0050132 A1* | 2/2008 | Boness | G03G 15/0131 399/40 |
| 2013/0068511 A1* | 3/2013 | Wu | H05K 3/048 174/250 |
| 2018/0117895 A1* | 5/2018 | Brook | D06C 15/00 |

FOREIGN PATENT DOCUMENTS

| | | | |
|---|---|---|---|
| EP | 2003941 A2 * | 12/2008 | |
| EP | 3291657 A1 * | 3/2018 | |
| WO | 01/33301 A1 * | 5/2001 | |
| WO | 2010/074736 A1 * | 7/2010 | |
| WO | 2016/142147 A1 * | 9/2016 | |
| WO | 2016194972 A1 * | 12/2016 | |

* cited by examiner

SYSTEM, APPARATUS, AND METHOD FOR PRODUCING PRINTED ELECTRICALLY CONDUCTIVE LINES

FIELD

The present disclosure relates to the field of printed electrical conductors, and more particularly, to conductive material being added to printed marking material or ink to create a printed electrical conductor.

BACKGROUND

Printed electronics is a set of printing methods used to create electrical devices on various substrates. Printing typically uses common printing equipment suitable for defining patterns on material, such as screen printing, flexography, gravure, offset lithography, and inkjet. By electronic industry standards, these are low cost processes. Electrically functional electronic or optical inks are deposited on the substrate, creating active or passive devices, such as thin film transistors; capacitors; coils; resistors. Printed electronics is expected to facilitate widespread, very low-cost, low-performance electronics for applications such as flexible displays, smart labels, decorative and animated posters, and active clothing that do not require high performance.

The term printed electronics is often related to organic electronics or plastic electronics, in which one or more inks are composed of carbon-based compounds. These other terms refer to the ink material, which can be deposited by solution-based, vacuum-based or other processes. Printed electronics, in contrast, specifies the process, and, subject to the specific requirements of the printing process selected, can utilize any solution-based material. This includes organic semiconductors, inorganic semiconductors, metallic conductors, nanoparticles, and nanotubes.

For the preparation of printed electronics nearly all industrial printing methods are employed. Similar to conventional printing, printed electronics applies ink layers one atop another. The most important benefit of printing is low-cost volume fabrication. The lower cost enables use in more applications. An example is radio-frequency identification (RFID) systems, which enable contactless identification in trade and transport. In some domains, such as light-emitting diodes printing does not impact performance.

Printing conductive traces is a challenging problem for the print industry today. One method, similar to that discussed above, is to print silver based ink with print heats. This solution is costly and in some cases requires sintering devices to bond the particles together. Other options under consideration include using conductive foils or using thermal printers and conductive rolls. In both of these solutions, there is significant waste. Also, xerography is disadvantaged for conductive printing because of problems associated with developing, transferring, and bonding/fusing conductive materials.

Thus, there is a long felt need for a method for printing electrically conductive lines which does not require expensive inks or conductive foils.

SUMMARY

According to aspects illustrated herein, there is provided a printed electrically conductive line, comprising a substrate comprising a top surface and a bottom surface, a first layer printed on the substrate, the first layer comprising an upper portion and a lower portion, and a second layer arranged on the first layer, the second layer comprising an electrically conductive material. In some embodiments, the first layer comprises a dry ink (e.g., toner). In some embodiments, the lower portion is arranged proximate to the top surface and the second layer is arranged proximate to the upper portion. In some embodiments, the first layer is fused with the substrate and the second layer is bonded with the first layer. In some embodiments, the second layer comprises graphite.

According to aspects illustrated herein, there is provided a method of producing an electrically conductive line, the method comprising providing a substrate, printing a first layer on the substrate, applying a powdered conductive material to the first layer, and bonding the powdered conductive material to the first layer.

According to aspects illustrated herein, there is provided a method of producing an electrically conductive line, the method comprising providing a substrate, printing a first layer on the substrate, applying a powdered conductive material to the first layer, and removing loose powdered conductive material from the substrate.

According to aspects illustrated herein, there is provided a module for producing an electrically conductive line, the module operatively arranged to collaborate with a printing unit, the module comprising an applicator for applying a powdered conductive material to a printable media, the printable media comprising a substrate including a printed layer, a heat press operatively arranged to bond the powdered conductive material to the printed layer, and a duster operatively arranged to remove unbonded powdered conductive material from the printable media.

According to aspects illustrated herein, there is provided a module for producing an electrically conductive line within a printable media, the module operatively arranged to collaborate with a printing unit, the module comprising an applicator operatively arranged to apply a powdered conductive material to at least a portion of the printable media, the printable media comprising a substrate including a printed layer, the printed layer including a first section and a second section, a heat press operatively arranged to bond the powdered conductive material to the first section, and a duster operatively arranged to remove unbonded powdered conductive material from the printable media.

According to aspects illustrated herein, there is provided a method of producing an electrically conductive line within at least a portion of a printable media, the method comprising providing a substrate, printing a printed layer on the substrate, the printed layer including a first section and a second section, applying a powdered conductive material to the printed layer, and bonding the powdered conductive material to the first section.

The present disclosure comprises a method implemented on a xerographic machine using toner, e.g., the XEROX® IGEN® printer, or other printer. Line patterns are printed on a substrate. The prints are then placed in a heat press such that the lines are in contact with a layer of graphite or graphene powder. Heating causes the graphite to adhere to the printed lines. The resistance of the resulting lines is approximately 18,000 Ohms, enough to support low-voltage applications such as a light emitting diode (LED).

The present disclosure may be implemented as, for example, a module that can be rolled up to and/or connected to the output of a printer, e.g., the XEROX® IGEN® printer, or other printer. The present disclosure may be used to add conductive traces to a printed media, for example a colored print.

The present disclosure may be implemented as, for example, a method and/or apparatus that adds conductive traces to just a portion of a printed media. For example, the present disclosure comprises a method and/or apparatus that transforms a portion of a printed media (e.g., a wine bottle label, a secure pharmaceutical drug label, etc.) into a conductive trace for, for example, the purposes of creating a RFID tag therein. In some embodiments, the portion of the printed media to be transformed to a conductive trace may comprise one or more layers of ink (e.g., dry ink, commonly known as toner) or other adhesive. In some embodiments, conductive material is only added to the portion of the printed media to be transformed into the conductive trace.

The present disclosure comprises a method in which a conductive material, for example powdered graphite or graphene, is bonded with heat and pressure to a xerographic print to produce electrically conductive traces. This method allows for low-cost production of printed electrically conductive circuits. In some embodiments, the conductive material is bonded to a thermoplastic (e.g., toner) and/or an adhesive.

These and other objects, features, and advantages of the present disclosure will become readily apparent upon a review of the following detailed description of the disclosure, in view of the drawings and appended claims.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

Figure 1:
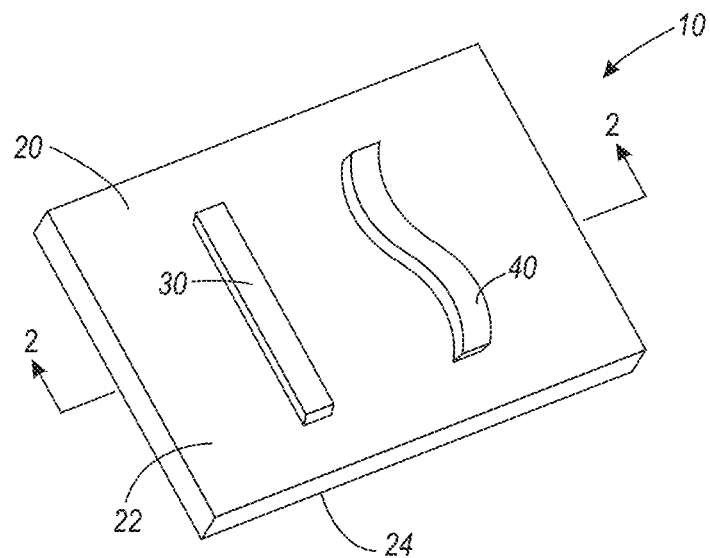
FIG. 1 is a perspective view of a printable media.

At the outset, it should be appreciated that like drawing numbers on different drawing views identify identical, or functionally similar, structural elements. It is to be understood that the claims are not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the claims.

Unless defined otherwise, all technical and scientific terms used herein have the same meaning as commonly understood to one of ordinary skill in the art to which this disclosure pertains. It should be understood that any methods, devices or materials similar or equivalent to those described herein can be used in the practice or testing of the example embodiments. The assembly of the present disclosure could be driven by hydraulics, electronics, pneumatics, and/or springs.

It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. The term "approximately" is intended to mean values within ten percent of the specified value.

It should be understood that use of "or" in the present application is with respect to a "non-exclusive" arrangement, unless stated otherwise. For example, when saying that "item x is A or B," it is understood that this can mean one of the following: (1) item x is only one or the other of A and B; (2) item x is both A and B. Alternately stated, the word "or" is not used to define an "exclusive or" arrangement. For example, an "exclusive or" arrangement for the statement "item x is A or B" would require that x can be only one of A and B. Furthermore, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

Moreover, as used herein, the phrases "comprises at least one of" and "comprising at least one of" in combination with a system or element is intended to mean that the system or element includes one or more of the elements listed after the phrase. For example, a device comprising at least one of: a first element; a second element; and, a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element. A similar interpretation is intended when the phrase "used in at least one of:" is used herein. Furthermore, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

"Process direction," as used herein, is intended to mean the direction print media travels through the system, while "cross-process direction" is intended to mean the direction perpendicular to the process direction. Furthermore, the words "printer," "printer system," "printing system," "printer device," and "printing device" as used herein encompass any apparatus, such as a digital copier, book-making machine, facsimile machine, multi-function machine, etc., which performs a print outputting function for any purpose. Additionally, as used herein, "web," "substrate," and "printable substrate" refer to, for example, paper, transparencies, parchment, film, fabric, plastic, photo-finishing papers or other coated or non-coated substrate media in the form of a web upon which information or markings can be visualized and/or reproduced. As used herein, the term "average" shall be construed broadly to include any calculation in which a result datum or decision is obtained based on a plurality of input data, which can include but is not limited to, weighted averages, yes or no decisions based on rolling inputs, etc.

As used herein, "fusing," with respect to dry ink, such as toner, is intended to mean supplying heat energy and/or pressure, having the effect of slightly liquefying the applied dry ink (toner) particles, in turn causing them to adhere to a surface.

Figure 2:
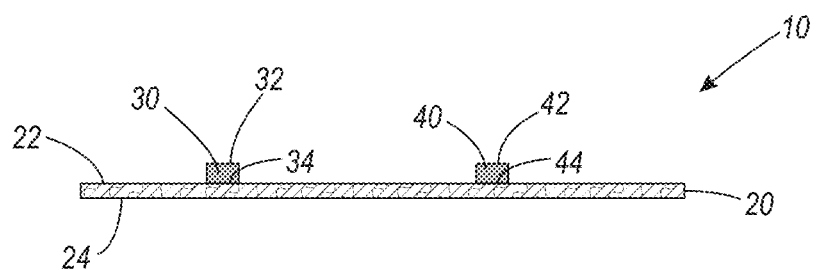
FIG. 2 is a cross-sectional view of the printable media taken generally along line 2-2 in FIG. 1.

Referring now to the figures, FIG. 1 is a perspective view of printable media 10. FIG. 2 is a cross-sectional view of printable media 10 taken generally along line 2-2 in FIG. 1. The following description should be read in view of FIGS. 1 and 2.

Printable media 10 comprises substrate 20 and an adhesive material, e.g., dry ink, which in common use is also called toner, arranged thereon. For example, and as shown, dry ink 30 in is linearly arranged on substrate 20 and dry ink 40 is curvilinearly arranged on substrate. Substrate 20 comprises top surface 22 and bottom surface 24. In some embodiments, substrate 20 comprises paper. However, it should be appreciated that substrate 20 may comprise any material suitable for fusion with a dry ink (e.g., toner), for example, transparencies, parchment, film, fabric, plastic, vinyl, polyester, photo-finishing papers or other coated or non-coated substrate media in the form of a web upon which information or markings can be visualized and/or reproduced, and that this disclosure should not be limited to only the use of paper. Dry ink is added to substrate 20, specifically top surface 22, as is known in the art via xerography. The use of a xerographic printer allows the dry ink to be quickly and precisely added to substrate 20 for a specific geometric arrangement. For purposes of this disclosure, dry ink 30 is arranged as a linear line and dry ink 40 is arranged as a curvilinear line; however, dry ink may be arranged on and fused with substrate 20 in any pattern, shape, geometry, etc. desired. Furthermore, it should be appreciated that dry ink 30 and 40 may comprise one or more layers of dry ink. For example, dry ink 30 may comprise three layers of dry ink printed/layered on top of one another. Such arrangement allows for a larger material height (e.g., a larger pile of toner) and results in better adhesion for the conductive material added thereto, as will be discussed in greater detail below.

After dry ink 30 and 40 is added to substrate 20, fusion occurs (i.e., dry ink 30 and 40 is fused to top surface 22). As shown in FIG. 2, fused dry ink 30 comprises upper portion 32 and lower portion 34, lower portion 34 being arranged proximate to, abutting against, and/or fused with top surface 22. Fused dry ink 40 comprises upper portion 42 and lower portion 44, lower portion 44 being arranged proximate to, abutting against, and/or fused with top surface 22. In some embodiments, and as previously mentioned, dry ink may comprise toner; however, it should be appreciated that dry ink may comprise or be substituted with any printable adhesive. Additionally, while the present disclosure envisions the use of a xerographic printer (e.g., the XEROX® IGEN® printer) for applying the dry ink to substrate 20, it should be appreciated that in some embodiments, an inkjet or other suitable printer may be used to apply an adhesive material (e.g., a material capable of adhering a conductive material), quickly and precisely to substrate 20.

Figure 3:
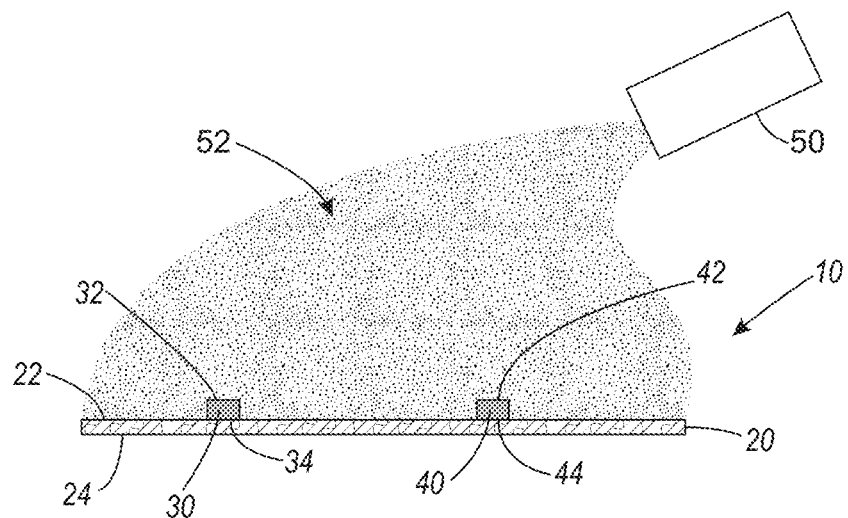
FIG. 3 is a cross-sectional view of the printable media shown in FIG. 2, with conductive material being added thereto.

FIG. 3 is a cross-sectional view of printable media 10, with powdered or soft conductive material 52 being added thereto. By "soft," it is meant that the conductive material has not been bonded or fused with dry ink 30 or 40, and it may still be easily removed from printable media 10 (e.g., by blowing or brushing it away). Powdered conductive material 52 may comprise, for example, graphite or graphene. It should be appreciated that conductive material 52 may comprise any conductive material suitable for being applied to printable media 10 and being bonded to dry ink 30 and 40 to create electrically conductive traces (e.g., solder in powdered form). In some embodiments, the particles of powdered conductive material 52 comprise a spherical geometry; however, any suitable particle form may be used, such as elongate particle shape, or flakes that are layered about each other. It should be appreciated that it is important that, after bonding, conductive material 52 forms an electrically conductive trace and that dry ink 30 and/or 40 does not create a discontinuity in between the particles of conductive material 52 that harms conductivity therethrough. Conductive material 52 may be added to printable media 10 using any means suitable for adequately covering dry ink 30 and dry ink 40 such that an electrically conductive trace is created. For example, conductive material 52 may be added to printable media 10 via an applicator, which provides a continuous or semi-continuous fall of conductive material, similar to that of a waterfall (e.g., a cascador). In some embodiments, the applicator applies conductive material 52 to printable media 10 by sprinkling and/or spreading it about top surface 22 and upper portions 32 and 42. In some embodiments, printable media 10 is dipped or at least partially submerged in a bed of conductive material 52 (i.e., printable media 10 is displaced downward with surface 22 being pressed into a pool or tray of conductive material 52).

Figure 4:
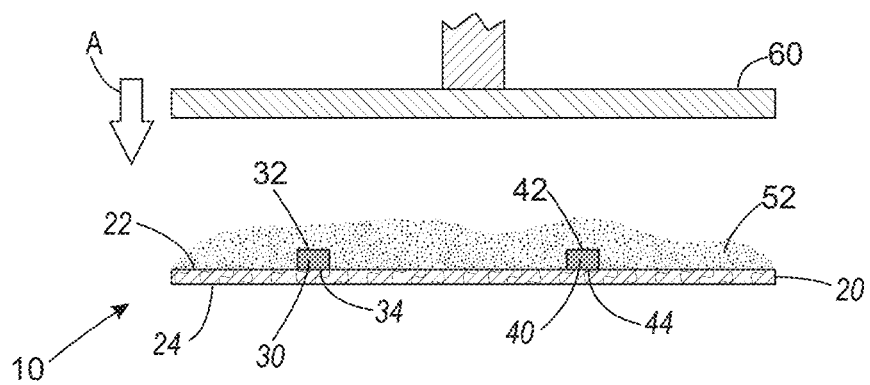
FIG. 4 is a cross-sectional view of the printable media shown in FIG. 3, with a heat press being applied thereto.

FIG. 4 is a cross-sectional view of printable media 10, with heat press 60 being applied thereto. As shown, conductive material 52 has been applied to printable media 10 and forms a layer which covers at least upper portion 32 and upper portion 42, and may also cover at least a portion of top surface 22. After a sufficient layer of powdered or soft conductive material 52 is applied to printable media 10 (as shown in FIG. 4), heat press 60 is applied thereto. Specifically, heat press 60 is displaced in the direction of arrow A to apply pressure and heat to printable media 10 and conductive material 52. In some embodiments, heat press 60 applies 380 degrees Fahrenheit to printable media 10 and conductive material 52 at a moderate pressure for 60 seconds. It should be appreciated that any means for applying heat and pressure to printable media 10 and conductive material 52 may be used, for example, rollers used for fusion as will be discussed in greater detail below. The heat applied by heat press 60 causes dry ink 30 and dry ink 40 to at least partially liquefy, and becomes tacky or sticky. At the same time, the pressure applied by heat press 60 causes conductive material 52 to bond, stick, and/or fuse to dry ink 30 and dry ink 40, specifically, to upper portion 32 and upper portion 42, respectively.

Figure 5:
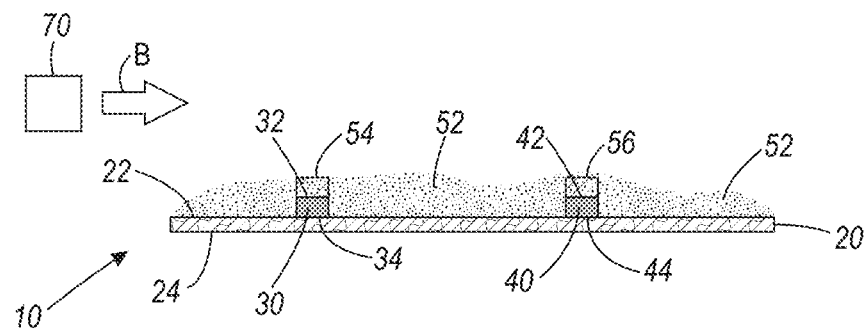
FIG. 5 is a cross-sectional view of the printable media shown in FIG. 4, with a duster being applied thereto.

FIG. 5 is a cross-sectional view of printable media 10, with duster 70 being applied thereto. After heat press 60 has applied sufficient heat and pressure to printable media 10 for a sufficient amount of time, heat press 60 is removed, at which point dry ink 30 and 40 returns to a solid state (i.e., dry ink 30 and 40 is no longer tacky or sticky). As shown, solid conductive material 54 is left bonded, stuck, and/or fused to upper portion 32 of dry ink 30 and solid conductive material 56 is left bonded, stuck, and/or fused to upper portion 42 of dry ink 40. Also left is powdered or soft conductive material 52 arranged at least partially on surface 22. Powdered conductive material 52 is still in a "loose" or unbonded/unfused state since it was not in proximity or arranged above dry ink. Duster 70 is utilized to remove the loose powdered conductive material 52 from surface 22. In an example embodiment, duster 70 comprises a blower, which applies a stream of gas to printable media, for example, in the direction of arrow B, to "blow" powdered conductive material 52 off of surface 22. In some embodiments, duster 70 comprises a mechanical arm including a brush that "sweeps" powdered conductive material 52 off of surface 22. In some embodiments, duster 70 applies acoustic vibrations to printable media 10 to remove powdered conductive material from surface 22.

Figure 6:
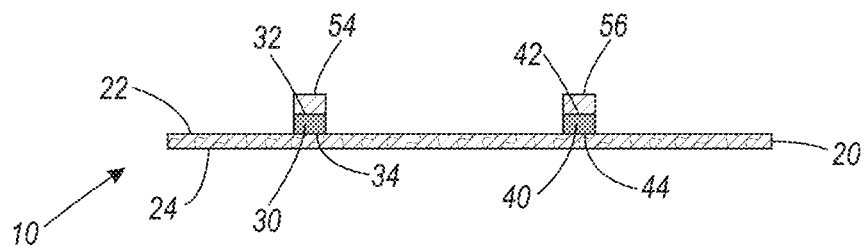
FIG. 6 is a cross-sectional view of the printable media shown in FIG. 5, with the loose conductive material removed and the solid conductive material remaining.

FIG. 6 is a cross-sectional view of printable media 10, with powdered conductive material 52 removed and solid conductive material 54 and 56 remaining. After duster 70 has removed powdered conductive material 52 from surface 22 of substrate 20, solid conductive material 54 remains as it is bonded to upper portion 32 of dry ink and conductive material 56 remains as it is bonded to upper portion 42 of dry ink. Solid conductive material 54 is an electrically conductive trace and solid conductive material 56 is an electrically conductive trace. It should be appreciated that the method described herein may be utilized to "print" a radio-frequency identification (RFID) tag or RFID antenna. In some embodiments, conductive traces formed by the method described herein may be used to power LEDs that are mounted to substrate 20 on conductive material 54 and/or 56. In some embodiments, the method described herein may be used to print labels for products or print labels onto products, wherein at least a portion of that label comprises solid conductive material (i.e., a printed label with a portion thereof forming an RFID/RFID antenna), as will be described in greater detail below with respect to FIG. 11.

Figure 7:
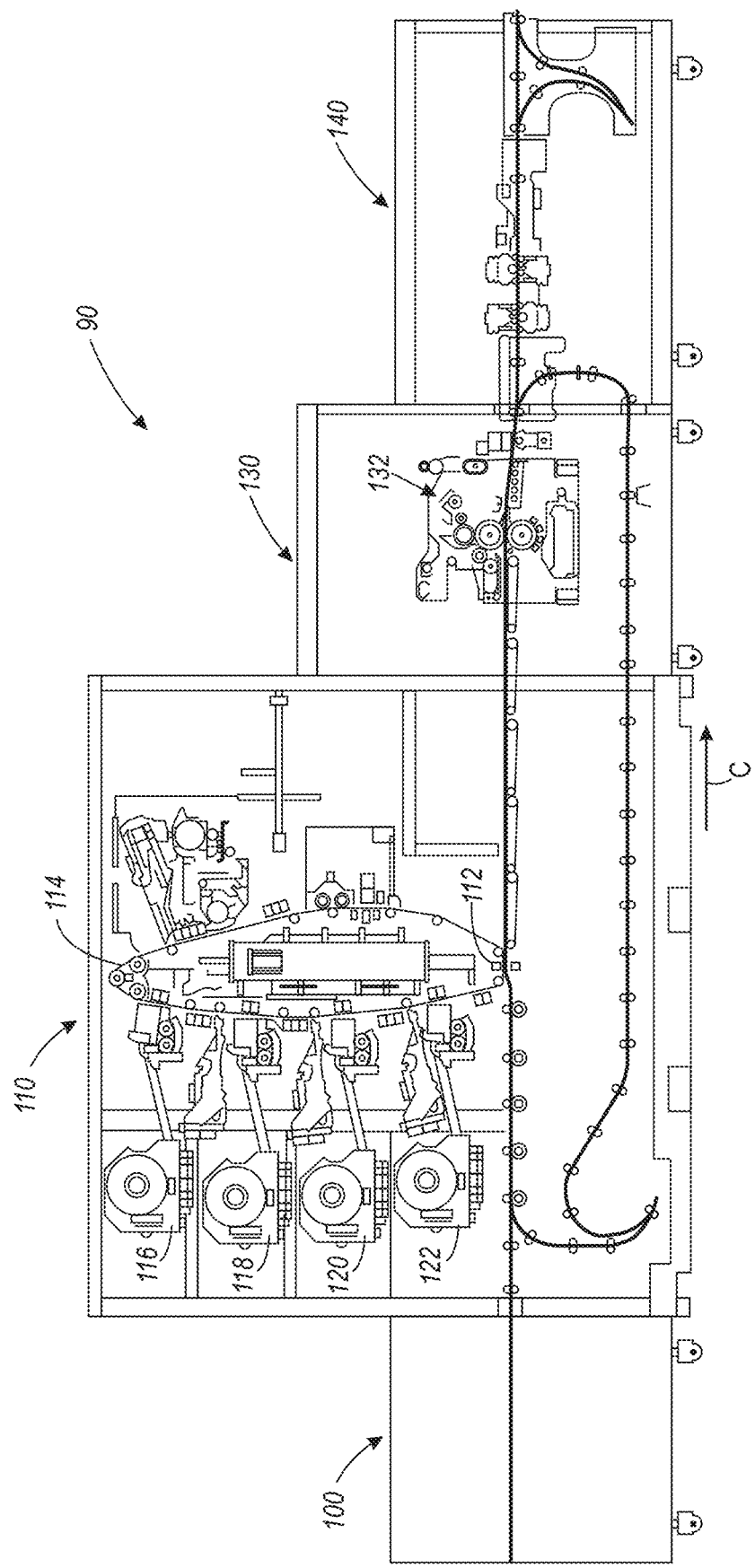
FIG. 7 is a schematic view of a prior art printing unit.

FIG. 7 is a schematic view of prior art printing unit 90. Printing unit 90 may be, for example, a XEROX® IGEN® printer as is described in U.S. patent application Ser. Nos. 16/180,713, 16/180,762, and 16/180,813, which applications are incorporated herein by reference in their entireties. Generally, printing unit 90 comprises feeder module 100, print engine tower, fuser module 130, and output module. The substrate or printable media, e.g., printable media 10, travels through printing unit 90 in the process direction indicated by arrow C.

Print engine tower 110 comprises one or more dry ink dispensers, for example, dry ink dispensers 116, 118, 120, and 122 and transfer belt 114. Some embodiments, e.g., embodiments including image formation by a dry ink, may benefit by printing systems that include what is known as an acoustic transfer assist (ATA) device. One of ordinary skill in the art will appreciate that printing systems that use a flexible belt in the process of forming an image thereon and subsequently transferring that image from the flexible belt to print media sometimes include one or more ATA devices. ATA devices use acoustic energy to drive the dry ink, e.g., toner, from the belt to the print media. Thus, in some embodiments, an ATA device, such ATA device 112, assists with transferring a dry ink from a belt to the malleable print media so that no direct contact between the belt and malleable material is necessary. It should be appreciated that such an arrangement may minimize image defects and thereby increase image quality. However, it should also be appreciated that conventional transfer of ink or marking material from a drum or other solid object is also possible.

Fuser module 130 comprises fuser 132. Fuser 132 applies heat and/or pressure to printable media 10 to fuse dry ink 30 and/or 40 to substrate 20. In some embodiments, fuser 132 comprises two rollers through which printable media 10 passed through.

Feeder module 100 feeds substrate into print engine tower 110. Print engine tower 110 and fuser module 130 apply or "print" and fuse dry ink 30 and/or 40 onto surface 22 of substrate 20. Output module 140 presents the finished printable media for retrieval.

Figure 8:
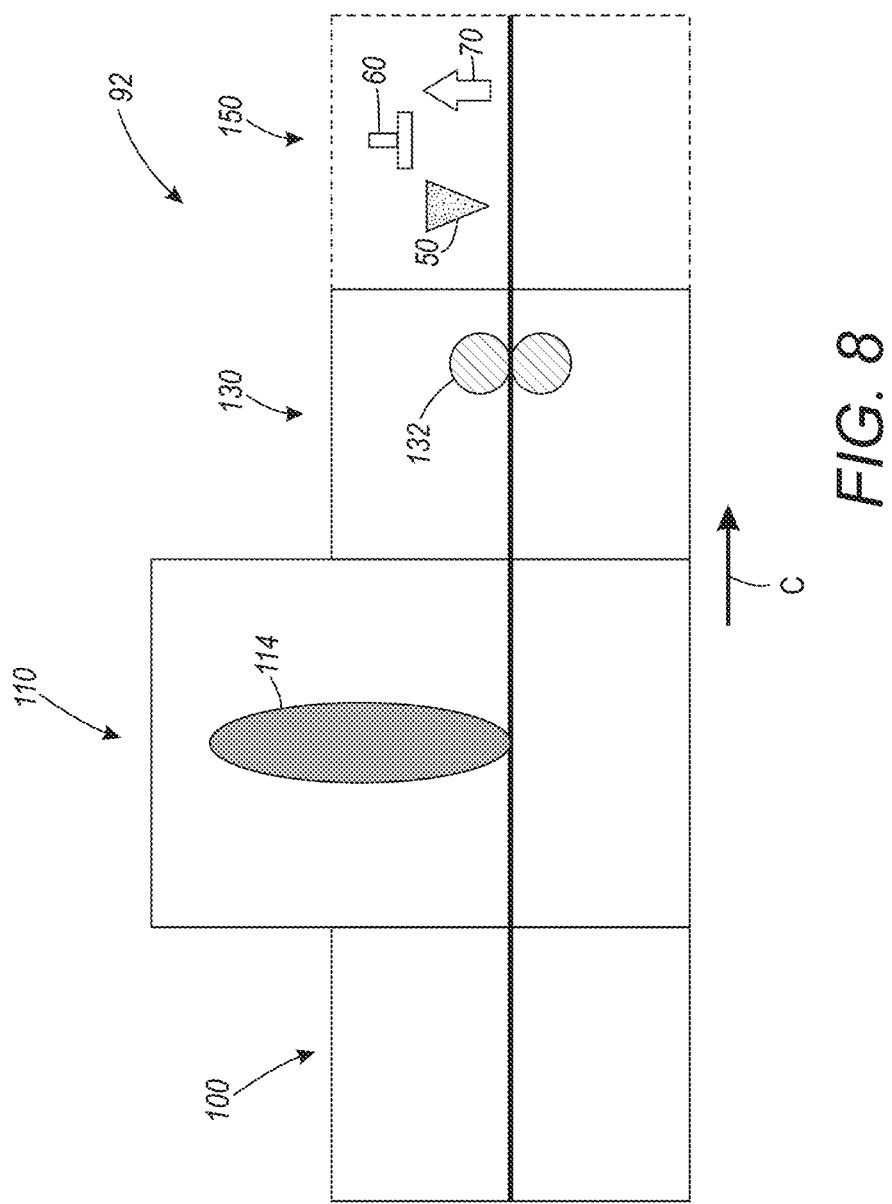
FIG. 8 is a schematic view of a printing unit.

FIG. 8 is a schematic view of printing unit 92. Printing unit 92 generally comprises feeder module 100, print engine tower 110, fuser module 130, and post-process module 150. In some embodiments, printing unit 92 further comprises an output module, e.g., output module 140. In the embodiment shown, the method for producing printed electrically conductive traces occurs in post-process module 150. Feeder module 100 feeds substrate 20 into print engine tower 110, which applies dry ink 30 and/or 40 to top surface 22. Subsequently, substrate 20 with unfused dry ink 30 and/or 40 is fed in process direction C to fuser module 130, wherein dry ink 30 and/or 40 is fused to substrate 20 via fuser 132 to form printable media 10. Printable media 10 then passes, either automatically or manually, to post-process module 150. In post-process module 150, applicator 50 applies powdered or soft conductive material 52 to printable media 10. Heat press 60 then applies heat and pressure to printable media 110 having conductive material 52 thereon. Conductive material 52 bonds to dry ink 30 and/or 40 to form solid conductive material 54 and/or 56 and create electrically conductive traces. Duster 70 then removes the remaining powdered or soft conductive material 52.

Figure 9:
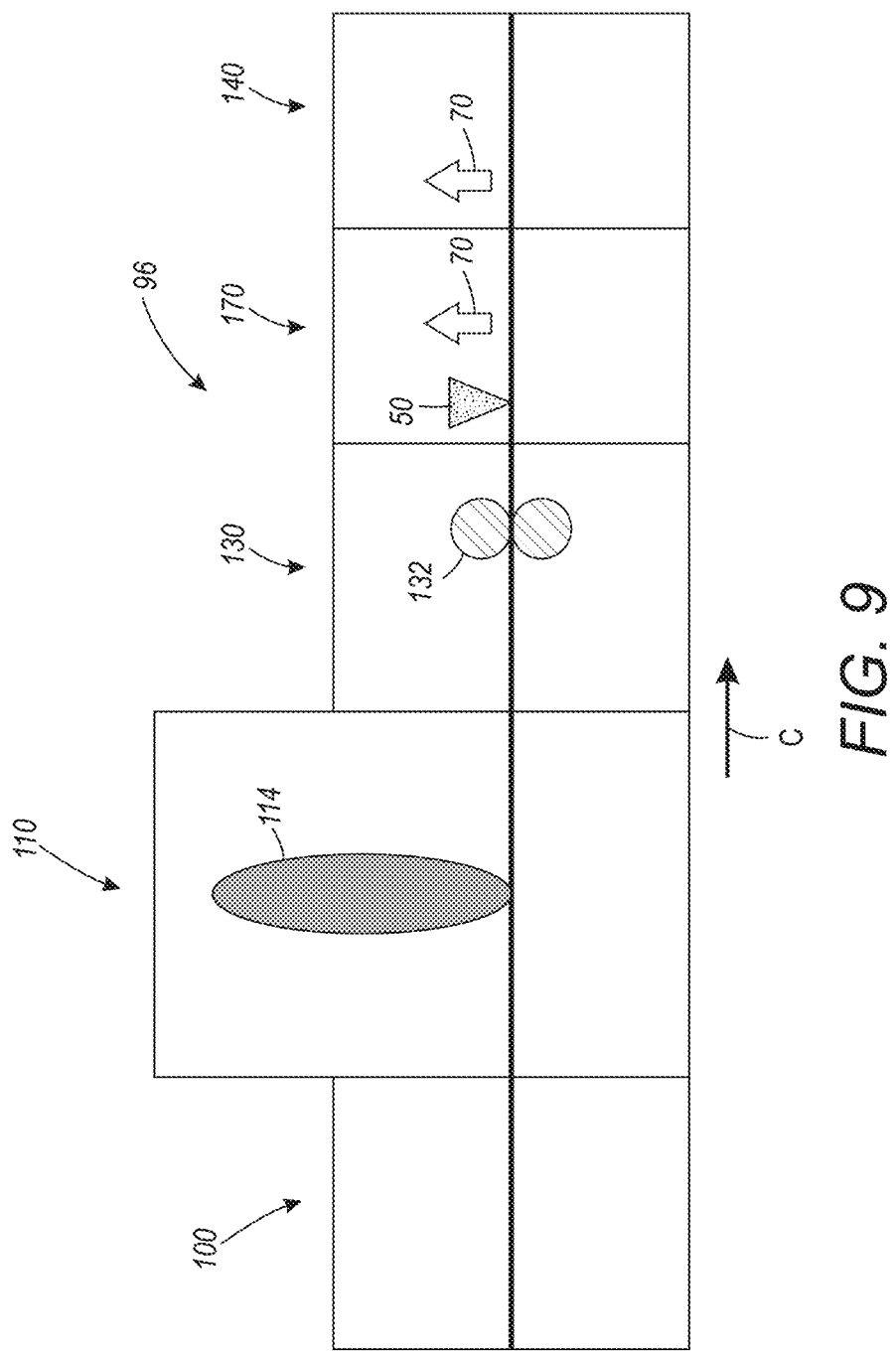
FIG. 9 is a schematic view of a printing unit.

FIG. 9 is a schematic view of printing unit 96. Printing unit 96 generally comprises feeder module 100, print engine tower 110, fuser module 130, and module 170. In some embodiments, printing unit 96 further comprises an output module, e.g., output module 140. In the embodiment shown, the method for producing printed electrically conductive traces occurs in module 170. In some embodiments, the components of module 170 can be distributed within a printer such that the method for producing printed electrically conductive traces occurs in feeder module 130 and output module 140. For example, applicator 50 may be arranged in fuser module 130 just following fuser 132 and duster 70 may be arranged in output module 140. Feeder module 100 feeds substrate 20 into print engine tower 110, which applies dry ink 30 and/or 40 to top surface 22. Subsequently, substrate 20 with unfused dry ink 30 and/or 40 is fed in process direction C to fuser module 130, wherein dry ink 30 and/or 40 is fused to substrate 20 via fuser 132 to form printable media 10. Immediately following fusion, printable media 10 is passed to module 170 wherein applicator 50 applies powdered or soft conductive material 52 to printable media 10. Soft conductive material 52 sticks to the still tacky/partially liquefied dry ink and bonds thereto, forming solid conductive material 54 and/or 56 and creating electrically conductive traces. Duster 70 then removes the remaining powdered or soft conductive material 52.

Figure 10:
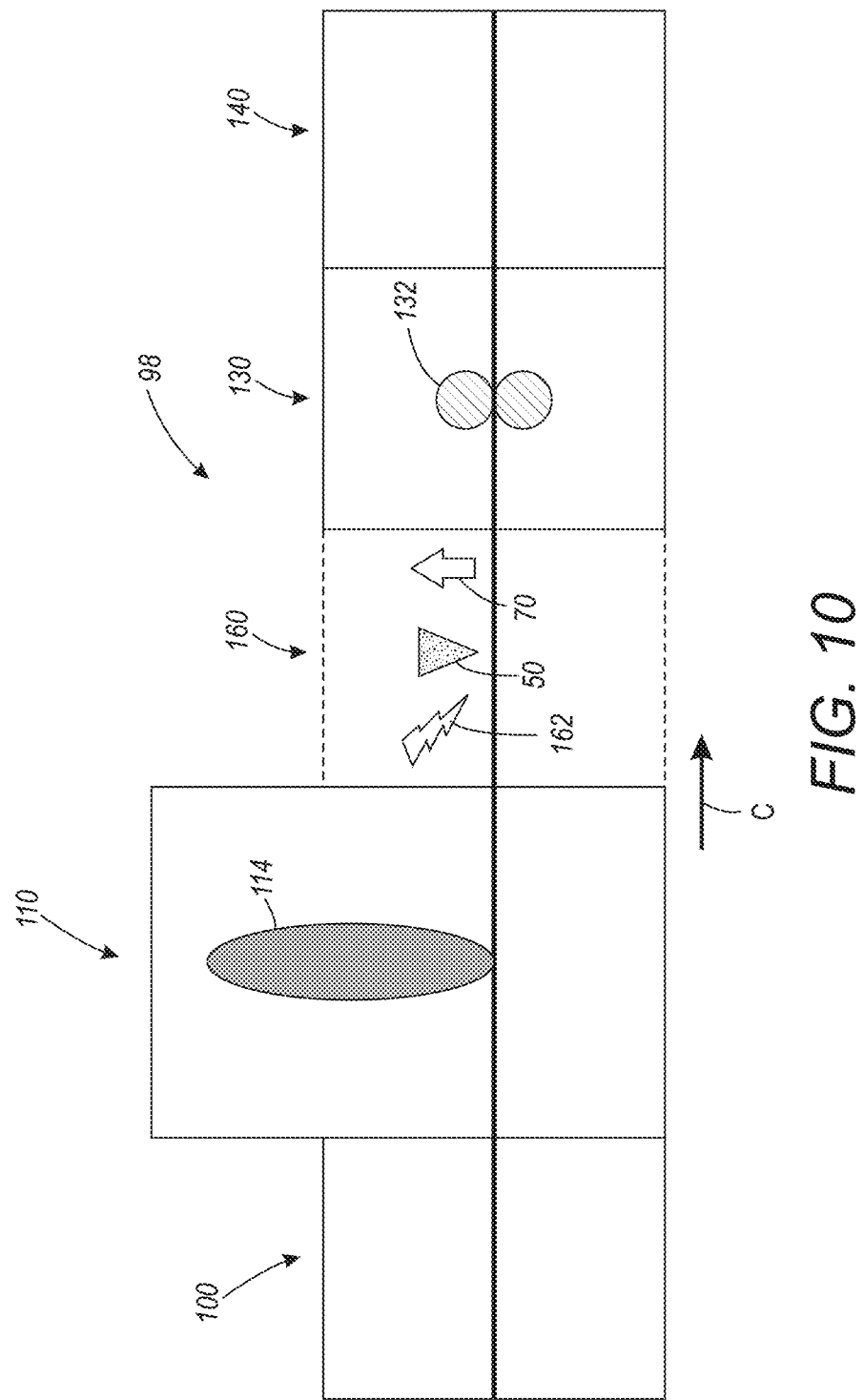
FIG. 10 is a schematic view of a printing unit.

FIG. 10 is a schematic view of printing unit 98. Printing unit 98 generally comprises feeder module 100, print engine tower 110, module 160, and fuser module 130. In some embodiments, printing unit further comprises an output module, e.g., output module 140. In the embodiment shown, the method for producing printed electrically conductive traces occurs in module 160. Feeder module 100 feeds substrate 20 into print engine tower 110, which applies dry ink 30 and/or 40 to top surface 22. Substrate 20 with unfused dry ink 30 and/or 40 is then fed into module 160, in which heat is applied via pre-heater 162. Pre-heater 162 may be, for example, a radiant heater. Applicator 50 then applies powdered or soft conductive material 52 to printable media 10, which sticks to the pre-heated and thus sticky/tacky dry ink 30 and/or 40. Duster 70 then removes the powdered or soft conductive material 52 that is not adhered to the sticky/tacky dry ink 30 and/or 40. Subsequently, the pre-heated substrate 20 with unfused dry ink 30 and/or 40 and applied powdered or soft conductive material 52 is fed in process direction C to fuser module 130. Fuser 132 (or a heat press) then applies heat and pressure to printable media 110 having conductive material adhered to dry ink 30 and/or 40. Conductive material 52 bonds with dry ink 30 and/or 40, and at the same time, dry ink 30 and/or 40 fuses to substrate 20, which forms solid conductive material 54 and/or 56 and creates electrically conductive traces. In the embodiment shown in FIG. 10, the method of producing printed electrically conductive traces may utilize powdered conductive materials (e.g., graphite, graphene, etc.) that are not operatively arranged to melt, or conductive materials that are arranged to melt (e.g., powdered solder). For example, for a conductive material that is arranged to melt: the conductive material in powdered form is applied to printable media 10 and sticks to the tacky dry ink. All conductive material that is not stuck to dry ink is removed by duster 70 prior to the application of heat. Fuser 132 then applies heat, which melts the conductive material to form a solid electrically conductive trace only where the dry ink is printed. Such embodiments may lead to a more conductive trace than those using conductive materials not arranged to melt.

In some embodiments, the method for producing printed electrically conductive traces occurs in print engine tower 110 and fuser module 130. It should be appreciated that the following description is not shown in the drawings, but can easily be envisioned by one having ordinary skill in the art. Feeder module 100 feeds substrate 20 into print engine tower 110, which applies dry ink 30 and/or 40 to top surface 22. Prior to entry into fuser module 130, heat is applied to substrate 20 with unfused dry ink 30 and/or 40 via pre-heater 162 (which is arranged in print engine tower 110). Pre-heater 162 may be, for example, a radiant heater. Subsequently, the pre-heated substrate 20 with unfused dry ink 30 and/or 40 is fed in process direction C to fuser module 130, which includes applicator 50, duster 70 and fuser 132. In fuser module 130, applicator 50 applies powdered or soft conductive material 52 to printable media 10, which sticks to the pre-heated and thus sticky/tacky dry ink 30 and/or 40. Duster 70 then removes the powdered or soft conductive material 52 that is not adhered to the sticky/tacky dry ink 30 and/or 40. Fuser 132 (or a heat press) then applies heat and pressure to printable media 110 having conductive material adhered to dry ink 30 and/or 40. Conductive material 52 bonds with dry ink 30 and/or 40, and at the same time, dry ink 30 and/or 40 fuses to substrate 20, which forms solid conductive material 54 and/or 56 and creates electrically conductive traces. In such embodiments, which is similar to that of FIG. 10, the method of producing printed electrically conductive traces may utilize powdered conductive materials (e.g., graphite, graphene, etc.) that are not operatively arranged to melt, or conductive materials that are arranged to melt (e.g., powdered solder). For example, for a conductive material that is arranged to melt: the conductive material in powdered form is applied to printable media 10 and sticks to the tacky dry ink. All conductive material that is not stuck to dry ink is removed by duster 70 prior to the application of heat. Fuser 132 then applies heat, which melts the conductive material to form a solid electrically conductive trace only where the dry ink is printed. Such embodiments may lead to a more conductive trace than those using conductive materials not arranged to melt.

Figure 11:
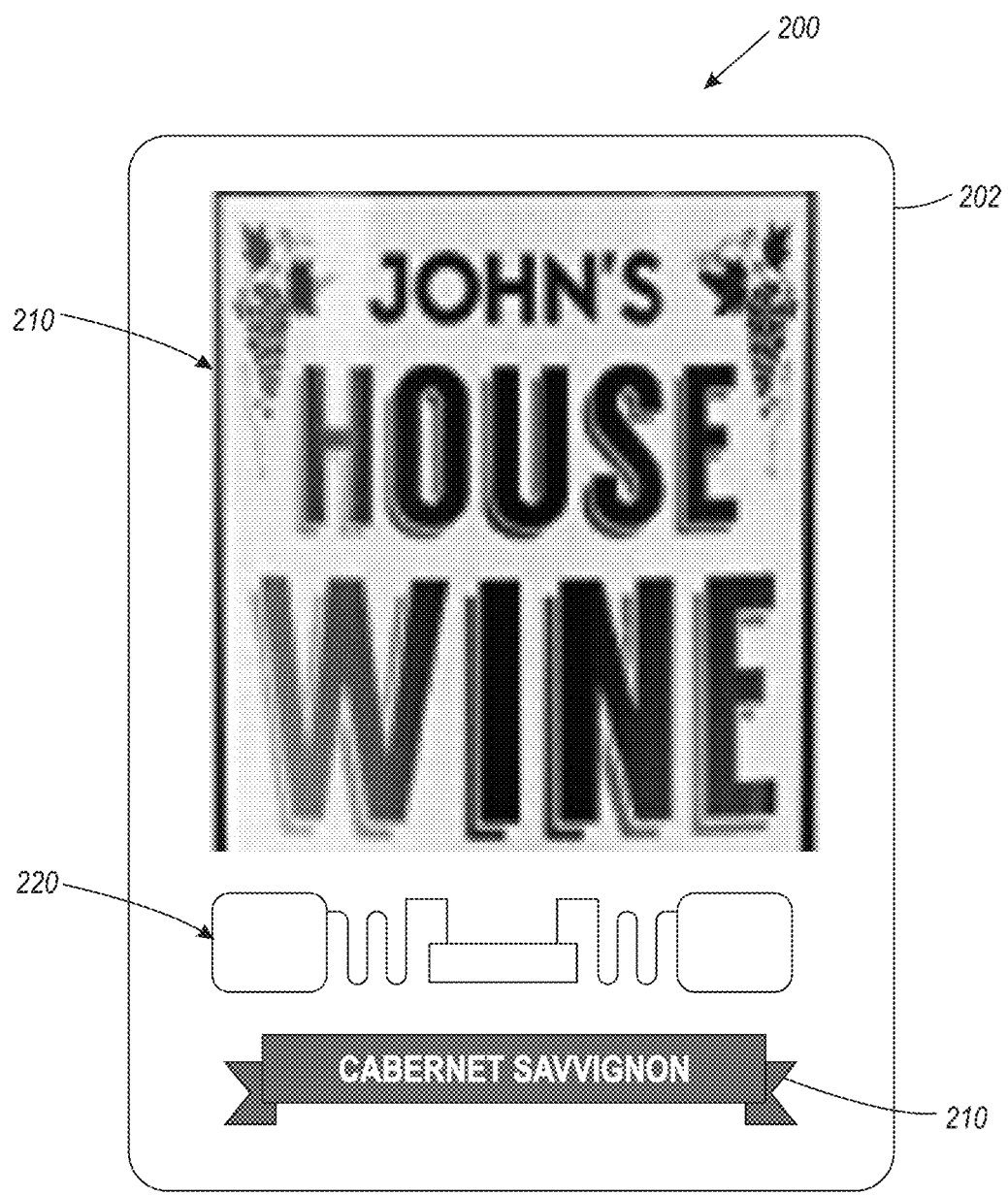
FIG. 11 is an elevational view of a label including both an artwork section and a conductive trace section formed using a method of the present disclosure.

FIG. 11 shows an elevational view of an example embodiment of label 200 having both an artwork section and a conductive trace section, formed using a method of the present disclosure. Label 200 generally comprises substrate 202, artwork section 210, and conductive trace section 220. Label 200 may be created using any of the methods for producing printed electrically conductive traces as discussed above. As shown, artwork section 210 includes the words "HOUSE WINE," a cluster of grapes at the upper left hand portion, a cluster of grapes at the upper right hand portion, and the words "CABERNET SAUVIGNON" on a decorative banner. Conductive trace section 220 includes an RFID antenna. Both artwork section 210 and conductive trace section 220 are applied/printed on substrate 202 in the same fashion, namely, using cyan, magenta, yellow, and key (CMYK) dry ink from a printer (e.g., the XEROX® IGEN® printer). In some embodiments, artwork section 210 comprises a single layer having one color layer of dry ink (e.g., magenta or green). In some embodiments, conductive trace section 220 may have one or more layers of dry ink. For example, the printer may "dump" or apply a larger amount of dry ink on substrate 202 at the location of conductive trace section 220 than at artwork section 210. Adding more dry ink at conductive trace section 220 allows conductive material 52 to better adhere to the dry ink. As such, a printer may add one layer of magenta to substrate 202 at artwork section 210 and add one layer of cyan, one layer of magenta, one layer of yellow, and one layer of key at conductive trace section 220. Subsequently, conductive material 52 is added to substrate 202 in order to be bonded to conductive trace section 220, as described above with reference to FIGS. 1-10. The method of the present disclosure allows labels and other printable media to be formed that include both an artwork section and a conductive trace section, allowing easy production using one printer.

In some embodiments of a typical color printing system, each of four CMYK development units (or dry ink dispensers) 116, 118, 120, and 122 is capable of placing, on a given small area in a printed image, dry ink coverage from 0-100% depending on the desired image to be printed. As such, for a full color image a given small area could theoretically receive 400% dry ink coverage, i.e., 100% dry ink coverage from each of CMYK development units 116, 118, 120, and 122 combined. However, in practice, when printing typical desired images, the maximum dry ink coverage on any area in an image is much less than the physical maximum dry ink coverage of 400%. For most customer images, a heavy application of dry ink would be a total of approximately 200% dry ink coverage (from all of the CMYK development units combined). Further, in some embodiments the maximum dry ink coverage for any given small area of an image is set, by hardware and/or software, at a cutoff limit of 270%.

One reason for this cutoff limit is to avoid physical stresses, as such would cause general contamination, on fuser 132.

In contrast, in the present disclosure the appearance of the dry ink corresponding to the conductive areas, for example conductive trace section 220, does not matter. Additionally, fuser 132 and its corresponding module may comprise special bypasses or modifications such that the total coverage of dry ink can be made suitable for application (i.e., to ensure that no damage is done to fuser 132). In such a case a relatively heavy, and even otherwise undesirable, total dry ink coverage could be chosen for conductive trace section 220. In some embodiments, it may be found that a sufficient total dry ink coverage for the purposes of applying powdered conductive material 52 to create a conductive trace (e.g., conductive material 54 and/or 56) could be a total dry ink coverage of greater than or equal to 300%. These high dry ink coverages could be commanded via well-known image file formats or channels, such as PDF. Furthermore, image data and commands for creating conductive traces could be combined, in the same data stream, with image data for printing regular images for human viewing. For example, and as shown in FIG. 11, label 200, which could be printed using the same data stream, comprises artwork section 210 and conductive trace section 220.

It will be appreciated that various aspects of the disclosure above and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

REFERENCE NUMERALS

- 10 Printable media
- 20 Substrate
- 22 Top surface
- 24 Bottom surface
- 30 Dry ink
- 32 Upper portion
- 34 Lower portion
- 40 Dry ink
- 42 Upper portion
- 44 Lower portion
- 50 Applicator
- 52 Conductive material (powder)
- 54 Conductive material (solid)
- 56 Conductive material (solid)
- 60 Heat press
- 70 Duster
- 90 Printing unit
- 92 Printing unit
- 96 Printing unit
- 98 Printing unit
- 100 Feeder module
- 110 Print engine tower
- 112 Acoustic transfer assist (ATA) device
- 114 Transfer belt
- 116 Dry ink dispenser
- 118 Dry ink dispenser
- 120 Dry ink dispenser
- 122 Dry ink dispenser
- 130 Fuser module
- 132 Fuser
- 140 Output module
- 150 Post-process module
- 160 Module
- 162 Pre-heater
- 170 Module
- 200 Label
- 202 Substrate
- 210 Section
- 220 Section
- A Arrow
- B Arrow
- C Arrow

What is claimed is:

1. A method of producing an electrically conductive line comprising a plurality of layers, the method comprising:
   providing a substrate;
   printing a first layer comprising a non-conductive toner material on the substrate;
   applying a powdered conductive material comprising at least one of graphite and graphene to the first layer;
   bonding the powdered conductive material to the first layer to form the electrically conductive line; and
   removing loose powdered conductive material from the substrate after bonding the powdered conductive material to the first layer,
   wherein bonding the powdered conductive material to the first layer comprises applying heat to the first layer; and, applying pressure to the powdered conductive material and the first layer.

2. The method as recited in claim 1, further comprising:
   prior to the step of applying the powdered conductive material to the first layer, fusing the non-conductive toner to the substrate.

3. The method as recited in claim 1, further comprising, after the step of printing first layer on the substrate:
   pre-heating the first layer.

4. The method as recited in claim 3, further comprising, after the step of applying the powdered conductive material to the first layer:
   removing loose powdered conductive material from the substrate.

5. The method as recited in claim 1, wherein the step of bonding the powdered conductive material to the first layer comprises:
   applying heat to the powdered conductive material and the first layer.

6. The method as recited in claim 1, wherein the method occurs at least partially within a print engine of a printer.

7. A method of producing an electrically conductive line, the method comprising:
   providing a substrate;
   printing a first layer comprising a non-conductive toner material on the substrate;
   pre-heating the first layer;
   after preheating the first layer, applying a powdered conductive material comprising at least one of graphite and graphene to the first layer; and,
   removing loose powdered conductive material from the substrate,
   wherein applying the powdered conductive material to the first layer comprises applying pressure to the powdered conductive material and the first layer.

8. The method as recited in claim 7, further comprising: fusing the non-conductive toner to the substrate.

9. A method of producing an electrically conductive line within at least a portion of a printable media, the method comprising:
   providing a substrate;

printing a first printed layer comprising a non-conductive toner material on the substrate, the first printed layer including a first image section and a second image section;

applying a powdered conductive material comprising at least one of graphite and graphene to the first printed layer; and, bonding the powdered conductive material to the first printed section to form the electrically conductive line and removing loose powdered conductive material from the substrate, wherein bonding the powdered conductive material to the first layer comprises applying heat to the first layer; and, applying pressure to the powdered conductive material and the first layer.

10. The method as recited in claim 9, further comprising: fusing the non-conductive toner to the substrate.

11. The method as recited in claim 9, further comprising: before the step of applying a powdered conductive material to the first printed layer, fusing the non-conductive toner to the substrate.

12. The method as recited in claim 9, further comprising, after the step of printing the first printed layer comprising toner on the substrate:
pre-heating the non-conductive toner.

13. The method as recited in claim 9, further comprising, after the step of applying a powdered conductive material to the first printed layer:
removing unbonded powdered conductive material from the substrate and the first printed layer.

14. The method as recited in claim 9, wherein the step of bonding the powdered conductive material to the first image section comprises:
applying heat to the powdered conductive material and at least the first image section of the first printed layer.

15. The method as recited in claim 9, wherein the step of printing the first printed layer comprising the non-conductive toner on the substrate comprises:
applying the non-conductive toner to the substrate corresponding to the first image section in a first predefined amount; and,
applying the non-conductive toner to the substrate corresponding to the second image section in a second predefined amount, which second predefined amount is less than the first predefined amount.

16. The method as recited in claim 11, wherein the step of applying a powdered conductive material to the first printed layer comprises:
applying the powdered conductive material to the first image section.

17. The method as recited in claim 9, wherein:
the second image section comprises a total non-conductive toner coverage percent that is less than or equal to a first threshold percent; and,
the first image section comprises a total non-conductive toner coverage percent that is greater than a second threshold percent.

18. The method as recited in claim 17, wherein the second threshold percent is greater than the first threshold percent.

19. The method as recited in claim 17, wherein the second threshold percent is at least 300% non-conductive toner coverage.

20. The method as recited in claim 17, wherein the first image section corresponds to the electrically conductive line and the second image section corresponds to a visible image, the first and second image sections being printed on the substrate via a single image file.

* * * * *